(12) United States Patent
Hashimoto et al.

(10) Patent No.: US 9,518,340 B2
(45) Date of Patent: Dec. 13, 2016

(54) METHOD OF GROWING GROUP III NITRIDE CRYSTALS

(71) Applicants: SixPoint Materials, Inc., Buellton, CA (US); Seoul Semiconductor Co., Ltd., Seoul (KR)

(72) Inventors: Tadao Hashimoto, Santa Barbara, CA (US); Edward Letts, Buellton, CA (US); Sierra Hoff, Solvang, CA (US)

(73) Assignees: SixPoint Materials, Inc., Buelton, CA (US); Seoul Semiconductor Co., Ltd., Seoul (KR)

( * ) Notice: Subject to any disclaimer, the term of this patent is extended or adjusted under 35 U.S.C. 154(b) by 258 days.

(21) Appl. No.: 13/833,443

(22) Filed: Mar. 15, 2013

(65) Prior Publication Data

US 2014/0087209 A1    Mar. 27, 2014

(51) Int. Cl.
  *H01L 21/02*  (2006.01)
  *C30B 29/40*  (2006.01)
  *H01L 29/20*  (2006.01)
  *C30B 7/10*   (2006.01)
  *B28D 5/04*   (2006.01)
  (Continued)

(52) U.S. Cl.
  CPC ............ *C30B 29/406* (2013.01); *B28D 5/045* (2013.01); *C30B 7/105* (2013.01); *C30B 25/20* (2013.01); *C30B 29/403* (2013.01); *C30B 29/64* (2013.01); *H01L 21/0254* (2013.01); *H01L 21/02389* (2013.01); *H01L 21/02628* (2013.01); *H01L 29/045* (2013.01); *H01L 29/2003* (2013.01); *H01L 29/32* (2013.01); *C30B 7/10* (2013.01);
  (Continued)

(58) Field of Classification Search
  CPC ..... B28D 5/045; C30B 29/403; C30B 29/406; C30B 29/64; C30B 7/105; H01L 21/02389; H01L 21/0254; H01L 21/02628; H01L 29/2003; Y10T 428/192
  See application file for complete search history.

(56) References Cited

U.S. PATENT DOCUMENTS 6,656,615 B2  12/2003  Dwiliński et al.
7,078,731 B2   7/2006  D'Evelyn et al.
(Continued)

FOREIGN PATENT DOCUMENTS

EP    2 031 103 A1    3/2009
JP    2012 031028 A   2/2012
(Continued)

OTHER PUBLICATIONS

U.S. Appl. No. 13/834,871 Office Action dated Jul. 3, 2014.
(Continued)

*Primary Examiner* — Michael Kornakov
*Assistant Examiner* — Hua Qi
(74) *Attorney, Agent, or Firm* — Strategic Innovation IP Law Offices, P.C.

(57) ABSTRACT

The present invention provides a method of growing an ingot of group III nitride. Group III nitride crystals such as GaN are grown by the ammonothermal method on both sides of a seed to form an ingot and the ingot is sliced into wafers. The wafer including the first-generation seed is sliced thicker than the other wafers so that the wafer including the first-generation seed does not break. The wafer including the first-generation seed crystal can be used as a seed for the next ammonothermal growth.

21 Claims, 5 Drawing Sheets

1 ⟶ ▭   Preparing an original seed crystal

2    Growing group III nitride crystal on both sides of the original seed crystal 3 
4   Slicing the grown group III nitride crystal into wafers. The thickness of the wafer including the original seed crystal is thicker than other wafers.

5    Growing group III nitride crystal on both sides of the wafer including the original seed crystal

(51) Int. Cl.
*C30B 29/64* (2006.01)
*C30B 25/20* (2006.01)
*H01L 29/04* (2006.01)
*H01L 29/32* (2006.01)

(52) U.S. Cl.
CPC .......... *Y10S 117/902* (2013.01); *Y10T 428/192* (2015.01)

(56) References Cited

U.S. PATENT DOCUMENTS

| | | | |
|---|---|---|---|
| 7,132,730 | B2 | 11/2006 | Dwiliński et al. |
| 7,160,388 | B2 | 1/2007 | Dwiliński et al. |
| 8,299,490 | B2 | 10/2012 | Oya et al. |
| 8,921,231 | B2 | 12/2014 | Hashimoto et al. |
| 9,202,872 | B2 | 12/2015 | Hashimoto et al. |
| 2002/0185054 | A1 | 12/2002 | Xu et al. |
| 2002/0186368 | A1 | 12/2002 | Rosengaus et al. |
| 2005/0103257 | A1 | 5/2005 | Xu et al. |
| 2005/0286590 | A1 | 12/2005 | Lee |
| 2006/0124956 | A1 | 6/2006 | Peng |
| 2007/0131214 | A1 | 6/2007 | Komeda |
| 2007/0178807 | A1 | 8/2007 | Gupta et al. |
| 2007/0234946 | A1 | 10/2007 | Hashimoto et al. |
| 2008/0182092 | A1* | 7/2008 | Bondokov et al. ........... 428/220 |
| 2009/0236694 | A1 | 9/2009 | Mizuhara et al. |
| 2010/0006082 | A1* | 1/2010 | Glinski et al. ............. 125/16.02 |
| 2010/0031875 | A1* | 2/2010 | D'Evelyn ................. 117/71 |
| 2010/0044718 | A1 | 2/2010 | Hanser et al. |
| 2010/0193664 | A1* | 8/2010 | Stoddard ................... 249/114.1 |
| 2010/0200955 | A1 | 8/2010 | Oshima |
| 2010/0270649 | A1 | 10/2010 | Ishibashi et al. |
| 2012/0000415 | A1 | 1/2012 | D'Evelyn et al. |
| 2014/0061662 | A1 | 3/2014 | Hashimoto et al. |
| 2014/0065796 | A1 | 3/2014 | Hashimoto et al. |
| 2014/0084297 | A1 | 3/2014 | Hashimoto et al. |
| 2014/0087113 | A1 | 3/2014 | Hashimoto et al. |
| 2014/0124826 | A1 | 5/2014 | Ishibashi et al. |
| 2015/0329361 | A1 | 11/2015 | Hashimoto |
| 2015/0330919 | A1 | 11/2015 | Hashimoto |
| 2016/0040318 | A1 | 2/2016 | Hashimoto et al. |

FOREIGN PATENT DOCUMENTS

| | | | |
|---|---|---|---|
| WO | WO 2004/053206 A1 | 6/2004 | |
| WO | WO2007/008198 A1 | 1/2007 | |
| WO | WO2007/117689 A1 | 10/2007 | |
| WO | WO 2008/042020 A2 | 4/2008 | |
| WO | 2009151642 | 12/2009 | |
| WO | WO 2009/149300 A1 | 12/2009 | |
| WO | WO 2010/017232 A1 | 2/2010 | |
| WO | WO 2010/025153 A1 | 3/2010 | |
| WO | WO 2010/088046 A1 | 8/2010 | |
| WO | WO 2014/035481 A1 | 3/2014 | |
| WO | WO 2014/051684 A1 | 4/2014 | |
| WO | WO 2014/051692 A1 | 4/2014 | |

OTHER PUBLICATIONS

U.S. Appl. No. 13/834,871 Response dated Oct. 2, 2014.
U.S. Appl. No. 13/835,636 Office Action dated Jun. 6, 2014.
U.S. Appl. No. 13/835,636 Response dated Sep. 8, 2014.
U.S. Appl. No. 13/835,636 Notice of Allowance dated Sep. 25, 2014.
PCTUS2013/032006 International Search Report and Written Opinion date of mailing Jun. 25, 2013 (14 pages).
Wang, B. et al., Inversion Domains and Parallel Growth in Ammonothermally Grown GaN Crystals; Journal of Crystal Growth, Elsevier, Amsterdam, NL. vol. 312, No. 18, Sep. 1, 2010, pp. 2507-2513, XP027184338, ISSN: 0022-0248 [retrieved on Apr. 9, 2010] p. 2509, col. 1, line 16-line 19.
PCTUS2013/032103 International Search Report and Written Opinion date of mailing Jun. 25, 2013 (17 pages).
U.S. Appl. No. 13/834,871 Final Office Action dated Dec. 3, 2014.
U.S. Appl. No. 13/798,530 Non-Final Office Action dated Dec. 26, 2014.
U.S. Appl. No. 13/834,871 Response dated Mar. 3, 2015.
U.S. Appl. No. 13/798,530 Response dated Mar. 26, 2015.
U.S. Appl. No. 13/834,015 Non-Final Office Action dated Apr. 8, 2015.
U.S. Appl. No. 13/798,530 Final Office Action dated Apr. 22, 2015.
U.S. Appl. No. 13/834,871 Non-Final Office Action dated Jun. 9, 2015.
Dwilinsky, et al., "Excellent Crystallinity of Truly Bulk Ammonothermal GaN," Journal of Crystal Growth 310, pp. 3911-3916, Jun. 18, 2008, doi:10.1016/j.jcrysgro.2008.06.036.
Porowski. S., "Near Defect Free GaN Substrates," MRS Internet Journal of Nitride Semiconductors, Res. 4S1, 1999, G1.3.
Inoue, T., et al., "Pressure-Controlled Solution Growth of Bulk GaN Crystals under High Pressure," pp. 15-27; Phys. Stat. Sol. (b) 223, 15 (2001).
Aoki, M., et al., "GaN Single Crystal Growth Using High-Purity Na as a Flux," Elsevier, Journal of Crystal Growth, pp. 70-76; 242, Apr. 12, 2002.
Iwahashi, et al., "Effects of Ammonia Gas on Threshold Pressure and Seed Growth for Bulk GaN Single Crystals by Na Flux Method," Journal of Crystal Growth, pp. 1-5, 253, Jan. 17, 2003; Elsevier, www.elsevier.com/locate/jcrysgro.
PCT/US2013/030913 International Search Report and Written Opinion date of mailing Jun. 5, 2013 (9 pgs.).
Croce, et al., "Étude Des Couches Minces Et Des Surfaces Par Réflexion Rasante, Speculaire Ou Diffuse, De Rayons X," Revue De Physique Appliquee, vol. 11, No. 1, pp. 113-125, Jan. 1, 1976, XP1417455; (English translation of abstract).
Sumiya, et al., "Growth Mode and Surface Morphology of a GaN Film Deposited Along the N-face Polar Direction on c-plane Sapphire Substrate," Journal of Applied Physics, vol. 88, No. 2, pp. 1158-1165, Jul. 15, 2000.
Takahashi, et al., "G-GIXD Characterization of GaN Grown by Laser MBE," The Institution of Electrical Engineers, Stevenage GB, Journal of Crystal Growth Elsevier Netherlands, vol. 237-239, No. 2, pp. 1158-1162, Apr. 1, 2002, XP-002697401, ISSN: 0022-0248.
U.S. Appl. No. 13/834,015 Response dated Aug. 10, 2015.
U.S. Appl. No. 13/834,015 Notice of Allowance dated Oct. 8, 2015.
U.S. Appl. No. 13/834,871 Response dated Oct. 9, 2015.
U.S. Appl. No. 13/834,871 Final Office Action dated Dec. 16, 2015.
U.S. Appl. No. 13/834,871 Response dated Mar. 16, 2016.
EP 13712085.3 Response and amendment dated Nov. 19, 2015.
EP 13714781.5 Response and amendment dated Nov. 26, 2015.

* cited by examiner

METHOD OF GROWING GROUP III NITRIDE CRYSTALS

CROSS REFERENCE TO RELATED APPLICATIONS

This application claims priority to U.S. Patent App. No. 61/705,540 filed Sep. 25, 2012, by inventors Tadao Hashimoto, Edward Letts, and Sierra Hoff, entitled "METHOD OF GROWING GROUP III NITRIDE CRYSTALS", which is incorporated by reference herein as if put forth in full below.

This application is related to the following U.S. patent applications:

PCT Utility Patent Application Serial No. US2005/024239, filed on Jul. 8, 2005, by Kenji Fujito, Tadao Hashimoto and Shuji Nakamura, entitled "METHOD FOR GROWING GROUP III-NITRIDE CRYSTALS IN SUPERCRITICAL AMMONIA USING AN AUTOCLAVE;"

U.S. Utility patent application Ser. No. 11/784,339, filed on Apr. 6, 2007, by Tadao Hashimoto, Makoto Saito, and Shuji Nakamura, entitled "METHOD FOR GROWING LARGE SURFACE AREA GALLIUM NITRIDE CRYSTALS IN SUPERCRITICAL AMMONIA AND LARGE SURFACE AREA GALLIUM NITRIDE CRYSTALS," which application claims the benefit under 35 U.S.C. Section 119(e) of U.S. Provisional Patent Application Ser. No. 60/790,310, filed on Apr. 7, 2006, by Tadao Hashimoto, Makoto Saito, and Shuji Nakamura, entitled "METHOD FOR GROWING LARGE SURFACE AREA GALLIUM NITRIDE CRYSTALS IN SUPERCRITICAL AMMONIA AND LARGE SURFACE AREA GALLIUM NITRIDE CRYSTALS;"

U.S. Utility Patent Application Ser. No. 60/973,662, filed on Sep. 19, 2007, by Tadao Hashimoto and Shuji Nakamura, entitled "GALLIUM NITRIDE BULK CRYSTALS AND THEIR GROWTH METHOD;"

U.S. Utility patent application Ser. No. 11/977,661, filed on Oct. 25, 2007, by Tadao Hashimoto, entitled "METHOD FOR GROWING GROUP III-NITRIDE CRYSTALS IN A MIXTURE OF SUPERCRITICAL AMMONIA AND NITROGEN, AND GROUP III-NITRIDE CRYSTALS GROWN THEREBY;"

U.S. Utility Patent Application Ser. No. 61/067,117, filed on Feb. 25, 2008, by Tadao Hashimoto, Edward Letts, Masanori Ikari, entitled "METHOD FOR PRODUCING GROUP III-NITRIDE WAFERS AND GROUP III-NITRIDE WAFERS;"

U.S. Utility Patent Application Ser. No. 61/058,900, filed on Jun. 4, 2008, by Edward Letts, Tadao Hashimoto, Masanori Ikari, entitled "METHODS FOR PRODUCING IMPROVED CRYSTALLINITY GROUP III-NITRIDE CRYSTALS FROM INITIAL GROUP III-NITRIDE SEED BY AMMONOTHERMAL GROWTH;"

U.S. Utility Patent Application Ser. No. 61/058,910, filed on Jun. 4, 2008, by Tadao Hashimoto, Edward Letts, Masanori Ikari, entitled "HIGH-PRESSURE VESSEL FOR GROWING GROUP III NITRIDE CRYSTALS AND METHOD OF GROWING GROUP III NITRIDE CRYSTALS USING HIGH-PRESSURE VESSEL AND GROUP III NITRIDE CRYSTAL;"

U.S. Utility Patent Application Ser. No. 61/131,917, filed on Jun. 12, 2008, by Tadao Hashimoto, Masanori Ikari, Edward Letts, entitled "METHOD FOR TESTING III-NITRIDE WAFERS AND III-NITRIDE WAFERS WITH TEST DATA;"

which applications are incorporated by reference herein in their entirety as if put forth in full below.

BACKGROUND

1. Field of the Invention

The invention is related to group III nitride crystals used to fabricate group III nitride wafers for various device fabrication including optoelectronic and electronic devices such as light emitting diodes, (LEDs), laser diodes (LDs), photo detectors, and transistors.

2. Description of the Existing Technology (Note: This patent application refers several publications and patents as indicated with numbers within brackets, e.g., [x]. A list of these publications and patents can be found in the section entitled "References.")

Gallium nitride (GaN) and its related group III nitride alloys are the key material for various optoelectronic and electronic devices such as LEDs, LDs, microwave power transistors and solar-blind photo detectors. However, the majority of these devices are grown epitaxially on heterogeneous substrates (or wafers), such as sapphire and silicon carbide since GaN wafers are extremely expensive compared to these heteroepitaxial substrates. The heteroepitaxial growth of group III nitride causes highly defected or even cracked films, which hinder the realization of high-end electronic devices, such as high-power microwave transistors.

To solve all fundamental problems caused by heteroepitaxy, it is indispensable to utilize group III nitride wafers sliced from group III nitride bulk crystals. For the majority of devices, GaN wafers are favorable because it is relatively easy to control the conductivity of the wafer and GaN wafer will provide the smallest lattice/thermal mismatch with most of device layers. However, due to the high melting point and high nitrogen vapor pressure at elevated temperature, it has been difficult to grow bulk GaN crystals. Currently, majority of commercially available GaN wafers are produced by a method called hydride vapor phase epitaxy (HVPE). HVPE is a vapor phase epitaxial film growth, thus difficult to produce bulk-shaped group III nitride crystals. Due to limitation of the crystal thickness, the typical density of line defects (e.g. dislocations) and grain boundaries is at the order of high $10^5$ to low $-10^6$ cm$^{-2}$.

To obtain high-quality group III nitride wafers of which density of dislocations and/or grain boundaries is less than $10^6$ cm$^{-2}$, a new method called ammonothermal growth, which grows group III nitride crystals in supercritical ammonia, has been developed [1-6]. Currently, high-quality GaN wafers having density of dislocations and/or grain boundaries less than $10^6$ cm$^{-2}$ can be obtained by ammonothermal growth. The ammonothermal growth is an analogue of hydrothermal growth of synthetic quartz. In the hydrothermal growth of quartz, naturally grown quartz crystals can be used as seed crystals. However, due to lack of natural crystal of group III nitrides, artificially grown crystals of group III nitrides must be used as seed crystals in the ammonothermal growth.

SUMMARY OF THE INVENTION

The present invention provides a method of growing an ingot of group III nitride. Group III nitride crystals such as GaN are grown by the ammonothermal method on both sides of a seed to form an ingot and the ingot is sliced into wafers. The wafer which includes the first-generation seed is sliced thicker than the other wafers so that the wafer including the first-generation seed does not break. The wafer including the first-generation seed crystal can be used as a seed for the next ammonothermal growth.

The present invention also provides a method of expanding the size of an ingot by placing multiple group III nitride wafers in two layers, with each edge on one layer attached and the edges on the first layer are staggered to the edges of the second layer.

BRIEF DESCRIPTION OF THE DRAWINGS

Referring now to the drawings in which like reference numbers represent corresponding parts throughout.

In the figure each number represents the followings:
1. The first generation seed,
2. Group III nitride crystals grown on both sides of the first-generation seed,
3. A wafer including the first-generation seed,
4. Other wafers,
5. Group III nitride crystals grown on both sides of the wafer including the first-generation seed.

Figure 2:
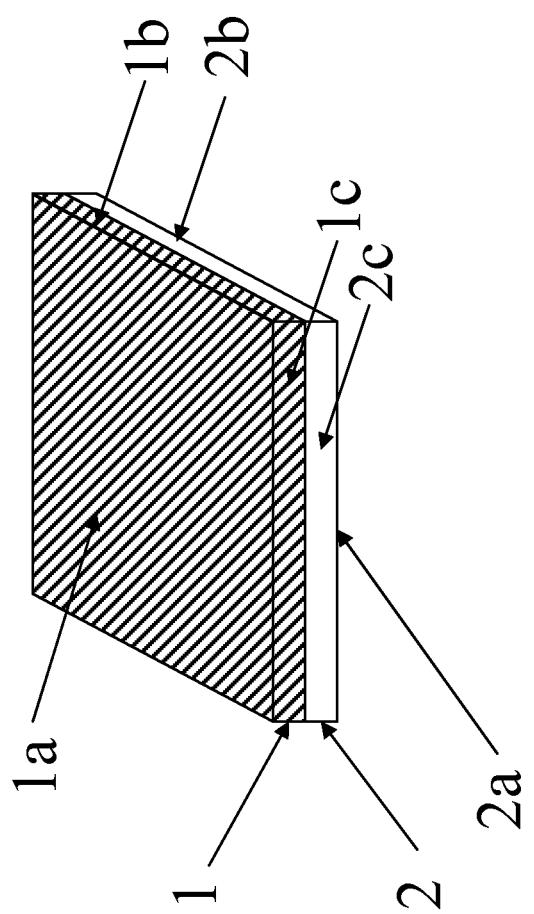

FIG. 2 is a seed crystal in one example.

In the figure each number represents the followings:
1. The first group III nitride wafer,
1a. Nitrogen face of the first group III nitride wafer,
1b. One edge of the first group III nitride wafer,
1c. Second edge of the first group III nitride wafer,
2. The second group III nitride wafer,
2a. (backside of the wafer) Nitrogen face of the second group III nitride wafer,
2b. One edge of the second group III nitride wafer,
2c. Second edge of the second group III nitride wafer.

Figure 3:
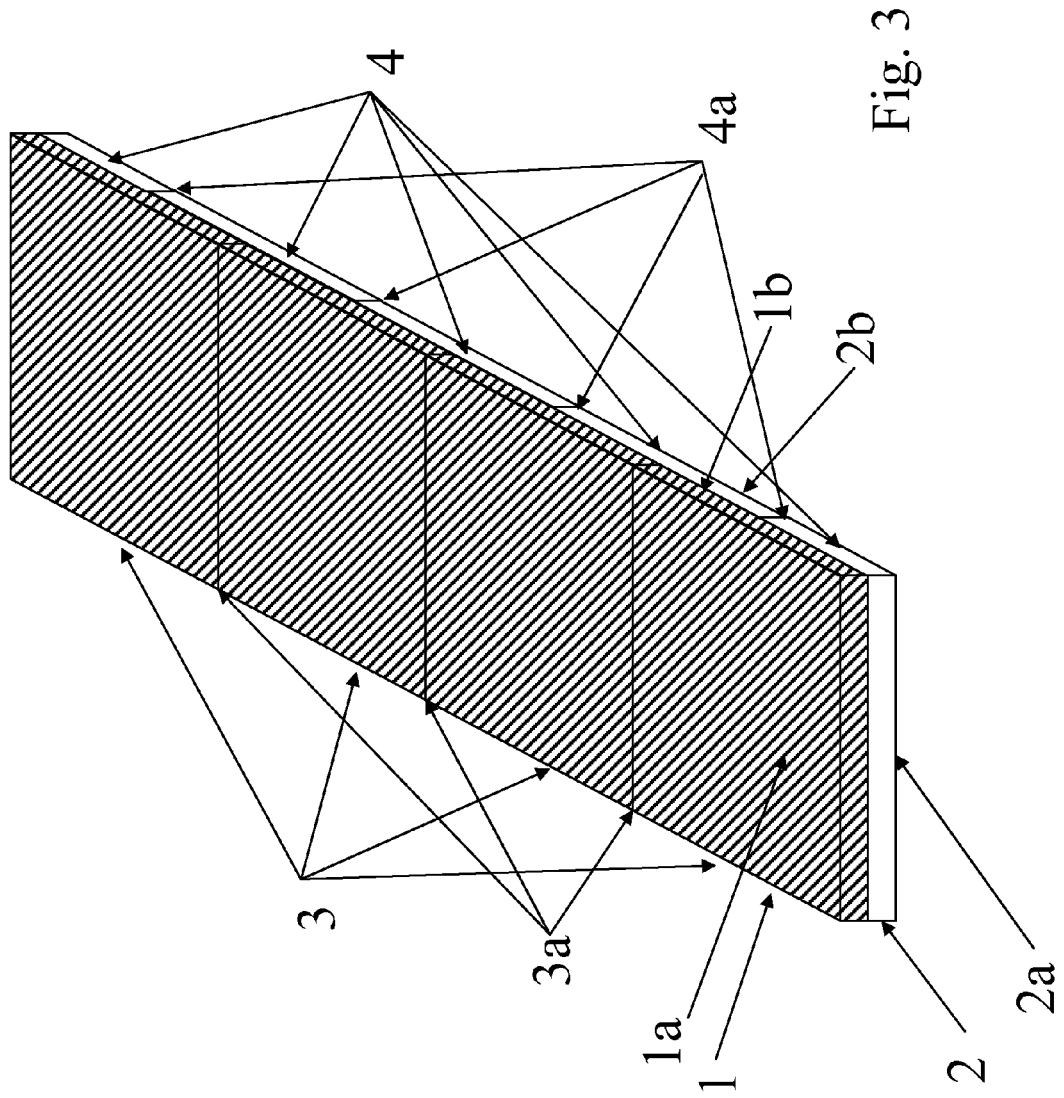

FIG. 3 is a seed crystal in one example.

In the figure each number represents the followings:
1. The first layer of group III nitride wafers,
1a. Nitrogen face of the first layer of group III nitride wafers,
1b. One edge of the first layer of group III nitride wafers,
2. The second layer of group III nitride wafers,
2a. (backside of the wafer) Nitrogen face of the second layer of group III nitride wafers,
2b. One edge of the second layer of group III nitride wafers,
3. Group III nitride wafers on the first layer,
3a. Edges of the group III nitride wafers on the first layer,
4. Group III nitride wafers on the second layer,
4a. Edges of the group III nitride wafers on the second layer.

Figure 4:
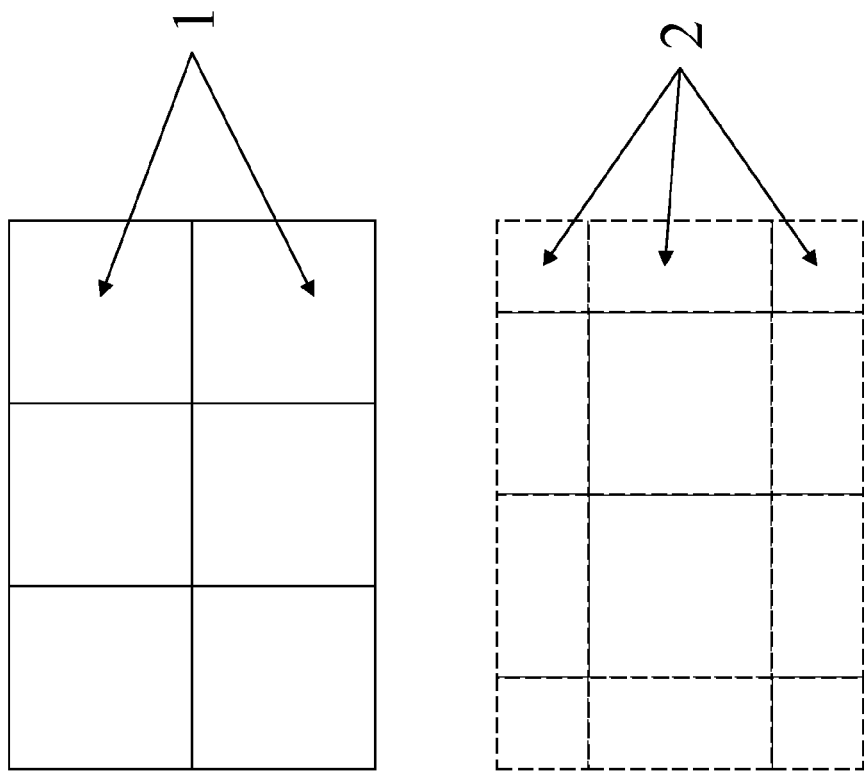

FIG. 4 is an example of configuration for group III nitride wafers for the first layer and the second layer.

In the figure each number represents the followings:
1. Group III nitride wafers on the first layer,
2. Group III nitride wafers on the second layer.

Figure 5:
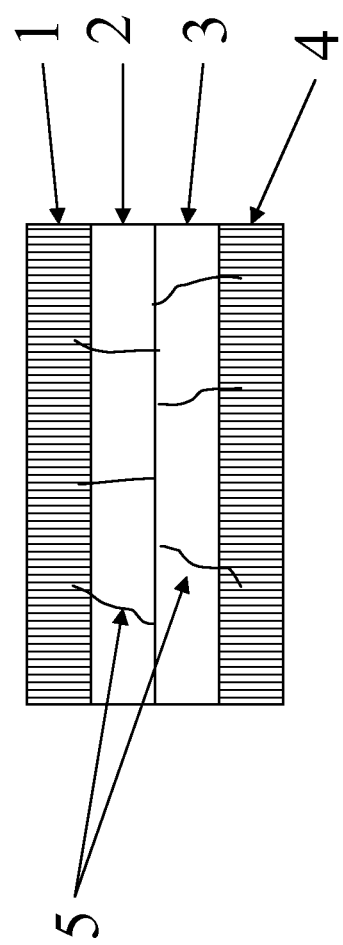

FIG. 5 is an expression of the situation where cracks stop at the interface of the group III nitride wafers.

In the figure each number represents the followings:
1. A group III nitride crystal grown by the ammonothermal method on a nitrogen polar surface of the first group III nitride wafer,
2. The first group III nitride wafer which is the part of the first-generation seed,
3. The second group III nitride wafer which is the part of the first-generation seed,
4. A group III nitride crystal grown by the ammonothermal method on a nitrogen polar surface of the second group III nitride wafer,
5. Cracks generated in the group III nitride crystal.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

The method of growing group III nitride wafer of the present invention provides an unbroken wafer including an original seed crystal, which can be used as a seed crystal for the next crystal growth.

Figure 1:
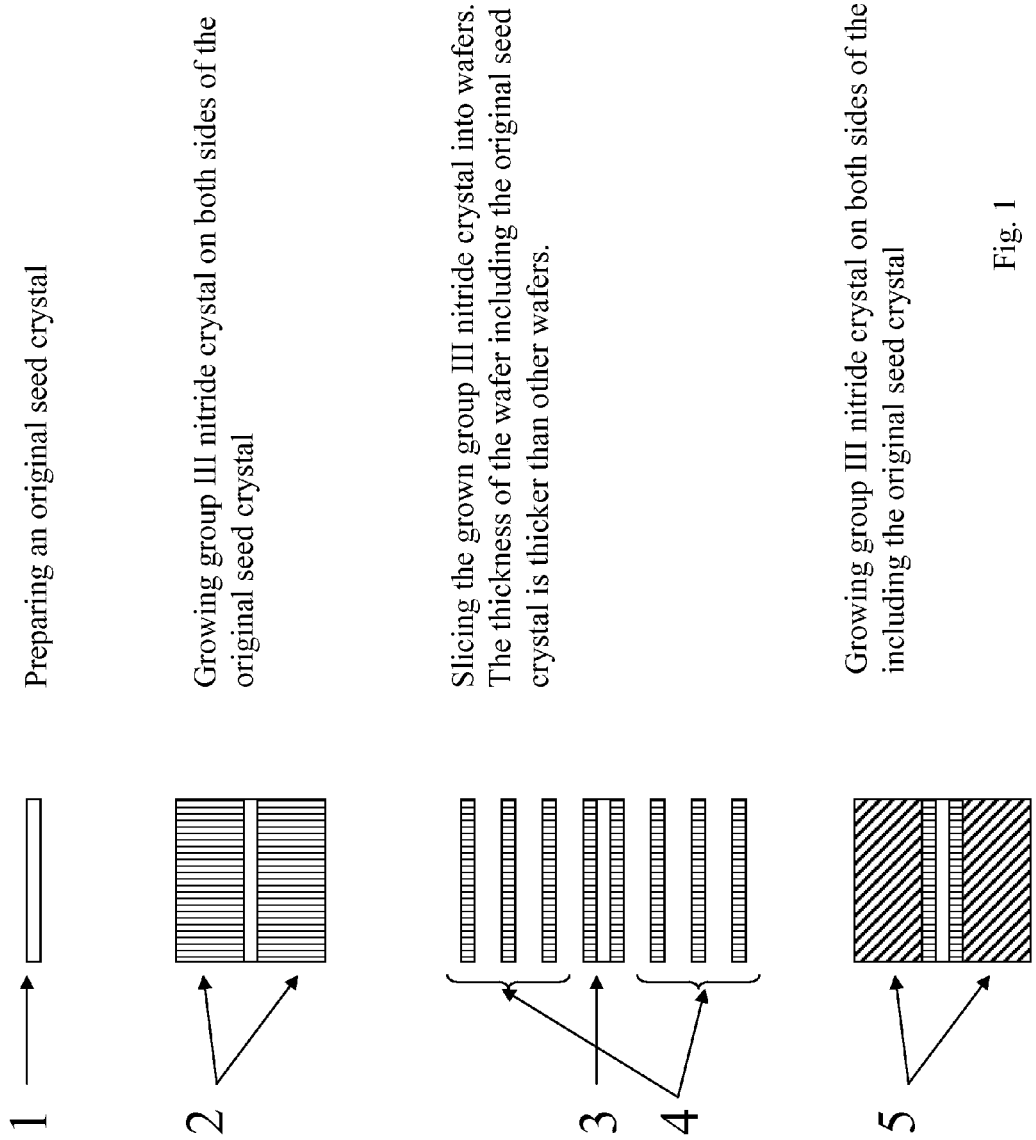
FIG. 1 is a process flow in one example.

FIG. 1 presents a process flow of one embodiment. Group III nitride crystals 2 are grown by the ammonothermal method on both sides of the first-generation HVPE-grown seed 1 to form an ingot of group III nitride. Then, the ingot is sliced into wafers 3 and 4, preferably with a multiple wire saw. Due to a slight difference in crystallographic lattice parameters (e.g. lattice constant or stress) between the first-generation seed 1 and the ammonothermally grown group III nitride crystals 2, the group III nitride crystals and the seed around the interface contains more cracks than the portion of the group III nitride crystal far from the seed 1. To avoid breaking of the wafer, the wafer which includes the first-generation seed 3 is sliced with a larger thickness than the other wafers 4 so that new group III nitride grown on a face of the first-generation seed is present on both the group III-polar face and the N-polar face and the original seed is covered with second-generation group III nitride on each of these faces. The unbroken wafer including the first-generation seed 3 is thus used as a seed in the next growth. The first-generation seed (which may be HVPE-grown group III nitride or ammonothermal-grown group III nitride) may have one or more cracks in the group III-polar surface, the N-polar surface, or both prior to growth of second-generation group III N on its faces. In addition, any cracks exposed on the group III-polar surface, the N-polar surface, or both of this wafer which includes the first-generation seed and also has second-generation (or later generation) group III nitride on its faces can be buried in successive crystal growth, relaxing the stress caused by mismatch of crystal nature between the HVPE-grown seed and ammonothermally grown crystals.

One way to slice the wafer including the first-generation seed thicker than the other wafers is setting the wire pitch of a multiple wire saw larger at the position of the first-generation seed. If a blade saw is used, the slicing thickness can be adjusted for each slice, thus it is easy to make the thickness of the wafer including the first-generation seed larger than the other wafers. However, a blade saw takes much longer time than a multiple wire saw, thus using a multiple wire saw is preferable.

As shown in FIG. 2, the first-generation seed can be composed of two pieces of group III nitride wafers 1 and 2 with group III polar faces or surfaces attached together so that nitrogen polar faces or surfaces 1a and 2a are exposed on the both sides. Some or all of the seeds may have been grown using HVPE, and some or all of the seeds may have been grown using ammonothermal method. Due to polarity of the group III nitride crystal, the crystal nature grown on group III polar surface is typically different from that grown on nitrogen polar surface. In the ammonothermal growth using alkali-based mineralizers, crystal quality on nitrogen polar surface is better than that on group III polar surface. Growth conditions may be selected to result in better crystal growth on the group III polar face or surface than on the nitrogen-polar face or surface, so one can choose to expose only the group III polar face or surface of the wafers by attaching together the nitrogen-polar faces or surfaces of adjacent wafers.

As shown in FIG. 3, the first generation seed can be composed of two layers of group III nitride wafers 1 and 2, in which one layer consists of multiple of group III nitride wafers 3 and 4 so that the crystal size can be much larger after growth. One way to make such composite seed is aligning a series of group III nitride wafers 3 arrayed on edges on the first layer 1 and aligning a series of group III nitride wafers 4 arrayed on edges on the second layer 2 by staggering edges on the first layer 3a from edges on the second layer 4a so that adjacent edges of wafers of first layer 3a sit against solid group III nitride of layer 4a, and adjacent edges of wafers of second layer 4a sit against solid group III nitride of layer 3a. To obtain high quality crystal, it is important to align the in-plane crystallographic orientations precisely. The crystallographic orientation can be confirmed with X-ray diffraction. Also, a flat orientation can be assured by aligning one or more edges of each rectangular and/or square GaN wafer against a flat block having edges that engage edges of the wafers. The wafers preferably have a regular shape such as a cylinder or a square, rectangle, or other polygon, and the wafers are preferably not irregular in shape (although pieces that are irregular may be formed into a regular shape, for instance, a regularly-shaped wafer that has broken may be pieced together into a regular shape). In addition, since lateral growth rate on a-plane is larger than that on m-plane, it is favorable to make a longer dimension along a-plane. In FIG. 2, the edges 1b and 2b are preferably a-plane, since edges 1b and 2b are longer than edges 1c and 2c respectively. The two seed layers 1 and 2 can be fixed to one another mechanically, physically, or chemically. For example, all wafers may be fixed with a mechanical clamp holding the wafers together along edges of the wafers. In other case, two wafers may be attached together with a soft metal such as gallium or indium placed between the layers and/or on edges such as 1c and 2c and/or along edges 1b and 2b. Also, all wafers may be fused together with a chemical agent such as superglue or other adhesive applied between the layers and/or along facing edges of adjacent wafers. However, a careful selection and application of the glue material is needed to minimize contamination of the crystal. The glue would preferably not contain a metal, catalyst, or mineral that would degrade the crystal structure of the seed (especially under growth conditions as found in e.g. an ammonothermal growth reactor). By slicing the wafer having second generation group III nitride grown upon the seed thick enough, the first generation seed can be re-used in the successive crystal growth runs. Since the alignment of in-plane crystallographic orientation requires precise control, re-using such composite first-generation seed to make a wafer wider and/or longer than any individual seed has a great benefit.

Some or all of the seeds of a first layer may be grown using HVPE, and some or all of the seeds of the first layer may have been grown using ammonothermal method. Some or all of the seeds of a second layer may be grown using HVPE, and some or all of the seeds of the second layer may have been grown using ammonothermal method. In one instance, a first layer is formed only of seeds made using ammonothermal method and a second layer is formed only of seeds made using HVPE. A seed in the first layer grown using ammonothermal method may optionally touch only seeds grown using ammonothermal method in the second layer. A seed in the first layer grown using ammonothermal method may optionally touch only seeds in the second layer that were grown using HVPE. Or, a seed in the first layer grown using ammonothermal method may optionally touch both a seed in the second layer grown using ammonothermal method and a seed in the second layer grown using HVPE.

The seed crystal can be composed of two-dimensional array of group III nitride wafers as shown in FIG. 4. The first layer 1 and the second layer 2 consist of two dimensionally arranged group III nitride wafers with edges on the first layer do not correspond to those on the second layer. The upper and lower two-dimensional arrays of wafers are joined together so that e.g. layer 1 sits upon layer 2 illustrated in FIG. 4. The individual seed wafers illustrated that together form each of layer 1 or layer 2 are offset or staggered both laterally and longitudinally so that none of the edges of layer 1 align with edges of layer 2 to have the same coordinates in x and y coordinates. Similar to the embodiment in FIG. 3, the in-plane crystallographic alignment is quite important to obtain highly oriented group III nitride crystal. To make two-dimensional array, it is preferable to use metal or chemical interlayer to attach the first layer and the second layer.

Again, some or all of the seeds of a first layer may be grown using HVPE, and some or all of the seeds of the first layer may have been grown using ammonothermal method. Some or all of the seeds of a second layer may be grown using HVPE, and some or all of the seeds of the second layer may have been grown using ammonothermal method. In one instance, a first layer is formed only of seeds made using ammonothermal method and a second layer is formed only of seeds made using HVPE. A seed in the first layer grown using ammonothermal method may optionally touch only seeds grown using ammonothermal method in the second layer. A seed in the first layer grown using ammonothermal method may optionally touch only seeds in the second layer that were grown using HVPE. Or, a seed in the first layer grown using ammonothermal method may optionally touch both a seed in the second layer grown using ammonothermal method and a seed in the second layer grown using HVPE.

EXAMPLE 1

Old Technology

An ingot of GaN was grown on a GaN seed crystal with the ammonothermal method using polycrystalline GaN as a nutrient, supercritical ammonia as a solvent, and sodium (4.5 mol % to ammonia) as a mineralizer. The temperature was between 500 to 550° C. and pressure was between 170 and 240 MPa. The first-generation seed consisted of two GaN wafers with gallium polar surface mating together. The total thickness of the seed was 643 microns. The thickness of the crystal after growth was 6.6 mm and the surface area was approximately 100 mm$^2$. A full-width half maximum (FWHM) of the X-ray diffraction from 002 plane was about 700~1000 arcsec. Although the crystal was not characterized with an optical and electrical measurement, those characteristics are expected to be the typical one for bulk crystal of GaN. For example, photoluminescence or cathode luminescence is expected to show luminescence from band-edge emission at around 370 nm, blue emission at around 400 nm, and/or yellow luminescence at around 600 nm. Conductivity type is expected to be n-type or n+ type with carrier concentration from $10^{17}$ to $10^{20}$ cm$^{-3}$. Optical absorption coefficient of such crystal is expected to be 50 cm$^{-1}$ or less. The lattice constant of the crystal was 51.86796 nm for c-lattice and 31.89568 nm for a-lattice. The lattice constant for GaN can change within 10% depending on growth conditions.

The crystal was sliced into c-plane wafers with a multiple wire saw using diamond slurry. The wire pitch was 670 microns with wire thickness of 170 microns, thus the expected slicing thickness is 500 microns. In this example, the pitch was uniform for the entire length of the GaN crystal. Nine wafers were fabricated from this particular crystal. The thickness of the each wafer was 319, 507, 543, 489, 504, 352 (seed crystal peeled), 492, 512 and 515 microns. However, the wafers which included the original seed crystals (wafer with 504 and 352 microns) were broken due to cracking in the crystal, thus the original seed crystal could not be re-used.

EXAMPLE 2

This Invention

An ingot of GaN was grown on a GaN seed with the ammonothermal method using polycrystalline GaN as a nutrient, supercritical ammonia as a solvent, and sodium (4.5 mol % to ammonia) as a mineralizer. The temperature was between 500 to 550° C. and pressure was between 170 and 240 MPa. The first-generation seed consisted of two GaN wafers with gallium polar surface mating together. The total thickness of the seed was 919 microns. The thickness of the crystal after growth was 4.2 mm and the surface area was approximately 100 mm$^2$. A full-width half maximum (FWHM) of the X-ray diffraction from 002 plane was about 700~1000 arcsec. The lattice constant of the crystal was 51.86641 nm for c-lattice and 31.89567 nm for a-lattice. The lattice constant for GaN can change within 10% depending of growth conditions.

The crystal was sliced into c-plane wafers with a multiple wire saw using diamond slurry. The wire pitch was 1425 microns with wire thickness of 170 microns for the wafer including the original seed crystal and 855 microns with wire thickness of 170 microns for the other wafers. Five wafers were fabricated from this particular crystal. The wafer thickness was 650, 699, 1191, 548, and 577 microns. The crystal contained cracking near the interface between the original seed crystal and the ammonothermally grown GaN; however, the cracks did not propagate through the interface between the two GaN wafers in the seed crystal (FIG. 5). By slicing the wafer including the original seed thicker than the other wafers, the wafer did not break and the wafer including the first-generation seed can be re-used in the next crystal growth. Also, mating two GaN wafers to form a seed is effective to prevent cracks from propagating all through the seed.

EXAMPLE 3

Preparation of a Seed Composed of Two Layers

Several wafers of GaN, which are sliced from an ingot of GaN, are coated with metallic gallium on the gallium polar surface. The coating can be done by physical pressing of gallium foil on the wafer or vacuum evaporation. Since metallic gallium does not wet the surface of GaN wafer, the forming liquid phase of gallium is preferably avoided. With addition of some sort of flux, such as an organic material or alkali metals may act as a wetting agent, if liquid phase coating of gallium is attempted.

The first set of gallium-coated GaN wafers are placed on a glass slide in an array on edges with the gallium coating face up. This array becomes the first layer. Next, the second set of gallium-coated GaN wafers are placed on top of the first layer, making the second layer. The edges of the first layer do not match the edges of the second layer so that the arrays of GaN wafers are staggered with respect to one another and therefore are mechanically stable (FIG. 3). After this, another glass slide is placed on top of the second layer so that the seed crystal is sandwiched by the glass slides. Then, the entire set is placed in a vacuum chamber. By slowly pumping down the air, the seed crystal is compressed by the glass slides and the two layers of individual wafers are fused to one another. If needed, the compression can be conducted at elevated temperature.

Advantages and Improvements

The current invention provides a group III nitride seed which is re-usable for next growth. Since artificially growing and preparing a seed of group III nitride require lots of time and effort, re-using the seed is critical for efficient production. Also, the current invention provides a group III nitride seed which is larger than the size of the ingot in the last growth. This way, enlargement of wafer size can be attained.

Possible Modifications

Although the preferred embodiment describes GaN crystal, the invention is applicable to other group III nitride alloys, such as AlN, AlGaN, InN, InGaN, or GaAlInN Although the preferred embodiment describes ammonothermal growth as a bulk growth method, other growth methods such as high-pressure solution growth, flux growth, hydride vapor phase epitaxy, physical vapor transport, or sublimation growth can be used as long as the growth method can grow crystals on both sides of a seed.

Although the preferred embodiment describes c-plane wafers, the invention is applicable to other orientations such as semipolar planes including 10-1-1 plane, 20-2-1 plane, 11-21 plane, and 11-22 plane. Also, the invention is applicable to wafers with misorientation within +/−10 degrees from a low-index plane (such as c-plane, m-plane, a-plane and semipolar planes).

Although the preferred embodiment describes slicing with a multiple wire saw, other slicing method such as an inner blade saw, an outer blade saw, multiple blade saw, and a single wire saw can also be used.

Consequently, the following is disclosed by way of example but not by way of limitation:
1. A method of making a group III nitride composed of $Ga_xAl_yIn_{1-x-y}N$ ($0 \leq x \leq 1$, $0 \leq x+y \leq 1$) comprising
    (a) growing a first group III nitride crystal on a first face and growing a second group III nitride crystal on a second face of a first-generation seed to form a first ingot of group III nitride;
    (b) slicing the first ingot into a first, second, and third wafer;
    wherein the first wafer includes the first-generation seed, and the first wafer has a thickness greater than a thickness of each of the second wafer and the third wafer, and wherein the thickness of the first wafer containing the first-generation seed is large enough to avoid breaking of the first wafer.
2. A method according to paragraph 1 and further comprising growing a third group III nitride crystal on a first face of said first wafer and a fourth group III nitride crystal on a second face of said first wafer.
3. A method according to paragraph 2, wherein the cracks exposed on the surface of the wafer including the first-generation seed are buried during the next growth.
4. A method according to any of paragraphs 1-3, wherein the both surfaces of the wafer which includes the first-generation seed are covered with group III nitride crystals grown on the first-generation seed.

5. A method according to any of paragraphs 1-4, wherein the group III nitride crystals are grown in supercritical ammonia.

6. A method according to any of paragraphs 1-5, wherein the ingot is sliced into wafers with a multiple wire saw having a different wire pitch for the wafer which includes the first-generation seed.

7. A method according to any of paragraphs 1-6, wherein the first-generation seed comprises two pieces of c-plane (misorientation within +/−10 degrees) group III nitride wafers with group III polar surface facing together so that nitrogen polar surfaces are exposed on both faces.

8. A method according to paragraph 7, wherein the in-plane crystallographic orientation of the c-plane (misorientation within +/−10 degrees) group III nitride wafers matches together.

9. A method according to paragraph 7 or paragraph 8, wherein cracks generated in the group III nitride crystals do not propagate the interface of the c-plane (misorientation within +/−10 degrees) group III nitride wafers.

10. A method according to any of paragraphs 7-9, wherein the shape and size of the c-plane (misorientation within +/−10 degrees) group III nitride wafers matches so that minimum area of group III polar surface is exposed.

11. A method according to any of paragraphs 1-6, wherein the first-generation seed comprises two layers of c-plane (misorientation within +/−10 degrees) group III nitride wafers with group III polar surface facing together so that nitrogen polar surfaces are exposed on both faces, each layer consists of multiple pieces of c-plane (misorientation within +/−10 degrees) group III nitride wafers arrayed on edges, the edges of the c-plane (misorientation within +/−10 degrees) group III nitride wafers on the first layer do not correspond to the edges of the c-plane (misorientation within +1-10 degrees) group III nitride wafers on the second layer, and in-plane crystallographic orientation of all wafers on the first and second layer matches.

12. A method according to paragraph 11, wherein cracks generated in the group III nitride crystals do not propagate the interface of the two layers of c-plane (misorientation within +/−10 degrees) group III nitride wafers.

13. A method according to paragraph 11 or paragraph 12, wherein the size and shape of each layer matches so that minimum area of group III polar surface is exposed.

14. A method according to paragraph 13, wherein the edge of the longer dimension of the layer is aligned to a-plane (misorientation within +/−10 degrees).

15. A method according to any of paragraphs 1-14, wherein the group III is gallium.

16. A method according to any of paragraphs 1-15 wherein the second wafer is formed from the first group III nitride crystal and the third wafer is formed from the second group III nitride crystal.

17. A method according to any of paragraphs 1-16 wherein the first group III nitride crystal has a crystalline structure polarity and the second group III nitride crystal has said crystalline structure polarity.

18. A method according to any of paragraphs 1-17 wherein said second and third wafer are members of a plurality of three or more wafers, and said first wafer is thicker than each wafer of said plurality of wafers.

19. A method of growing an ingot of group III nitride composed of $Ga_xAl_yIn_{1-x-y}N$ ($0 \le x \le 1$, $0 \le x+y \le 1$) comprising
   (a) growing a first group III nitride crystal on a first face of a seed; and
   (b) growing a second group III nitride crystal on a second face of the seed;
   wherein the seed comprises
      (1) a first layer comprised of
         a) a first group III nitride wafer having
            1) a first crystalline lattice orientation and
            2) a first edge adjacent to a first face and a second face of the first group III nitride wafer
         b) a second group III nitride wafer having
            1) a second crystalline lattice orientation and
            2) a first edge adjacent to a first face and a second face of the second group III nitride wafer
         c) the second group III nitride wafer having its first edge adjacent to the first edge of the first group III nitride wafer in the first layer and
         d) the first crystalline lattice orientation being the same as the second crystalline lattice orientation in the first layer,
      (2) a second layer comprises
         a) a third group III nitride wafer having
            1) a third crystalline lattice orientation and
            2) a first edge adjacent to a first face and a second face of the third group III nitride wafer
         b) a fourth group III nitride wafer having
            1) a fourth crystalline lattice orientation and
            2) a first edge adjacent to a first face and a second face of the fourth group III nitride wafer
         c) the third group III nitride wafer having its first edge adjacent to the first edge of the fourth group III nitride wafer in the second layer and
         d) the third crystalline lattice orientation being the same as the fourth crystalline lattice orientation in the second layer, and
      (3) wherein the first edge of first group III nitride wafer of the first layer is positioned at the first face of the third group III nitride wafer of the second layer
      (4) wherein the first edge of the second group III nitride wafer of the first layer is positioned at the first face of the third group III nitride wafer of the second layer
      (5) wherein the first edge of the third group III nitride wafer of the second layer is positioned at the first face of the second group III nitride wafer of the first layer
      (6) wherein the first edge of the fourth group III nitride wafer of the second layer is positioned at the first face of the second group III nitride wafer of the first layer, and
      (7) wherein the crystal lattice orientation of the first wafer of the first layer matches the crystal lattice orientation of the third wafer of the second layer.

20. A method according to paragraph 19, wherein the crystal lattice orientation of the first, second, third, and fourth group III nitride wafers is c-plane having a misorientation within +/−10 degrees, and the first faces of the first, second, third, and fourth group III nitride wafers face one another, and the second faces of the first, second, third, and fourth group III nitride wafers are nitrogen polar surfaces.

21. A method according to paragraph 19 or paragraph 20, wherein the first and second group III nitride crystals are grown simultaneously in supercritical ammonia.
22. A method according to any of paragraphs 19-21, wherein an adhesive layer is inserted between the first layer and the second layer to adhere the layers together.
23. A method according to paragraph 22, wherein the adhesive layer is metallic.
24. A method according to paragraph 23, wherein the metal comprises gallium or indium.
25. A method according to any of paragraphs 19-24, wherein the first and second layers composed of the group III nitride wafers are attached together by applying pressure.
26. A method according to any of paragraphs 19-25, wherein the first layer has a long edge, and wherein the long edge of the first layer is aligned to a-plane of the first wafer and the second wafer, with misorientation within +/−10 degree.
27. A method according to any of paragraphs 19-26, wherein the second layer has a long edge, and wherein the long edge of the second layer is aligned to a-plane of the third wafer and the fourth wafer, with misorientation within +/−10 degree.
28. A method according to any of paragraphs 19-27, wherein the group III nitride is gallium nitride.
29. A method of fabricating group III nitride wafers composed of $Ga_xAl_yIn_{1-x-y}N$ ($0 \leq x \leq 1$, $0 \leq x+y \leq 1$) comprising
   (a) growing group III nitride crystals on both faces of a seed of group III nitride to form an ingot of group III nitride;
   (b) slicing the ingot of group III nitride into wafers with a multiple wire saw wherein the pitch of the wire is changed so that the wafer which includes the seed is thicker than other wafers sliced from the ingot.
30. A method according to paragraph 29, wherein the thickness of the wafer which includes the seed crystal is large enough to avoid breaking of the wafer.
31. A method according to paragraph 29 or paragraph 30, wherein the group III nitride crystals are grown in supercritical ammonia.
32. A method according to any of paragraphs 29-31, wherein the group III nitride is gallium nitride.
33. A group III nitride ingot grown by a method of any of paragraphs 1-28.
34. Group III nitride wafers fabricated by a method of any of paragraphs 29-32.
35. A group III nitride seed having a first uncracked surface and a second uncracked surface comprising a first layer of group III nitride wafers, the first layer having a first face and a second face, and a second layer of group III nitride wafers, the second layer having a first face and a second face, the first face of the first layer facing the first face of the second layer, the second face of the first layer having at least one crack, and overlying the second face of the first layer a sufficient thickness of group III nitride to provide said first uncracked surface.
36. A group III nitride seed according to paragraph 35 wherein the second face of the second layer has at least one crack, and overlying the second face of the second layer is a sufficient thickness of the group III nitride to provide the second uncracked surface of the group III nitride seed.
37. A group III nitride seed according to paragraph 35 or paragraph 36, wherein the wafers of the first layer are c-plane wafers and the wafers of the second layer are c-plane wafers, each having misorientation within +/−10 degrees.
38. A group III nitride seed according to any of paragraphs 35-37, wherein the first uncracked surface and the second uncracked surface are each nitrogen polar surfaces.
39. A group III nitride seed according to paragraph any of paragraphs 35-38 wherein the second face of the first layer and the second face of the second layer are each nitrogen polar faces.
40. A group III nitride seed composed of two or more wafers contacting one another along a face rather than along an edge of the seeds, and wherein at least one of the wafers is selected from the group consisting of (a) wafers having a surface crack; (b) cracked wafers formed using HVPE and therefore having a value of density of line defects (e.g. dislocations) and grain boundaries greater than $10^5$ cm$^{-2}$; and (c) wafers formed using ammonothermal method.
41. A group III nitride seed composed of a first and a second wafer contacting one another along a face rather than along an edge of the seeds, and wherein the first wafer is offset from the second wafer so that an edge of the first wafer does not align with an edge of the second wafer.
42. A seed according to paragraph 40 or paragraph 41 wherein the first wafer is offset from the second wafer along all edges of the first wafer.
43. A set of at least three wafers cut from the same ingot comprising a first wafer having a thickness greater than a thickness of a second wafer and greater than a thickness of a third wafer, and wherein the first wafer has an embedded portion formed of a seed formed of at least one of:
   (a) a group III nitride having a density of line defects and grain boundaries greater than $10^5$ cm$^{-2}$;
   (b) a group III nitride in which the seed has a surface crack and the first wafer has first and second faces that are not cracked.
44. An ingot formed of a first layer having a first and a second seed and a second layer having a third and a fourth seed, wherein an edge of the first seed is not aligned with a corresponding edge of any seed in the second layer.
45. An ingot according to paragraph 44 wherein the first seed has no edge aligned with a corresponding edge of any seed in the second layer.
46. A seed composed of a first group III nitride wafer secured to a second group III nitride wafer, wherein the first wafer has a crack propagating from a first face to a second face of the first wafer, wherein the second wafer has a crack propagating from a first face to a second face of the second wafer, and wherein the seed has a regular shape from which an ingot may be formed.
47. A seed according to paragraph 46 wherein the first group III nitride wafer comprises GaN and the second group III nitride wafer comprises GaN.
48. An ingot of crystalline group III nitride having the formula $Ga_xAl_yIn_{1-x-y}N$ ($0 \leq x \leq 1$, $0 \leq x+y \leq 1$) and having a first face and a second face, the first face having a crystalline structure polarity and the second face also having said crystalline structure polarity.
49. An ingot according to paragraph 48 wherein the first face has nitride polarity and the second face has nitride polarity.

50. An ingot according to paragraph 48 wherein the first face has group III element polarity and the second face has group III element polarity.

REFERENCES

The following references are incorporated by reference herein:

[1] R. Dwiliński, R. Doradziński, J. Garczyński, L. Sierzputowski, Y. Kanbara, U.S. Pat. No. 6,656,615.

[2] R. Dwiliński, R. Doradziński, J. Garczyński, L. Sierzputowski, Y. Kanbara, U.S. Pat. No. 7,132,730.

[3] R. Dwiliński, R. Doradziński, J. Garczyński, L. Sierzputowski, Y. Kanbara, U.S. Pat. No. 7,160,388.

[4] K. Fujito, T. Hashimoto, S, Nakamura, International Patent Application No. PCT/US2005/024239, WO07008198.

[5] T. Hashimoto, M. Saito, S, Nakamura, International Patent Application No. PCT/US2007/008743, WO07117689. See also US20070234946, U.S. application Ser. No. 11/784,339 filed Apr. 6, 2007.

[6] D'Eyelyn, U.S. Pat. No. 7,078,731.

[7]. S. Porowski, MRS Internet Journal of Nitride Semiconductor, Res. 4S1, (1999) G1.3.

[8] T. Inoue, Y. Seki, O. Oda, S. Kurai, Y. Yamada, and T. Taguchi, Phys. Stat. Sol. (b), 223 (2001) p. 15.

[9] M. Aoki, H. Yamane, M. Shimada, S. Sarayama, and F. J. DiSalvo, J. Cryst. Growth 242 (2002) p. 70.

[10] T. Iwahashi, F. Kawamura, M. Morishita, Y. Kai, M. Yoshimura, Y. Mori, and T. Sasaki, J. Cryst Growth 253 (2003) p. 1.

What is claimed is:

1. A method of making a group III nitride composed of $Ga_xAl_yIn_{1-x-y}N$ ($0 \leq x \leq 1$, $0 \leq x+y \leq 1$) comprising:
   (a) growing a first group III nitride crystal on a first face and growing a second group III nitride crystal on a second face of a first-generation seed to form a first ingot of group III nitride;
   (b) slicing the first ingot into a first, second, and third wafer;
   wherein the first wafer includes the first-generation seed, and the first wafer has a thickness greater than a thickness of each of the second wafer and the third wafer, and wherein the thickness of the first wafer containing the first-generation seed is large enough to avoid breaking of the first wafer.

2. A method according to claim 1 and further comprising growing a third group III nitride crystal on a first face of said first wafer and a fourth group III nitride crystal on a second face of said first wafer.

3. A method according to claim 2, wherein cracks exposed on the surface of the first wafer including the first-generation seed are buried during the next growth.

4. A method according to claim 1, wherein both surfaces of the first wafer which includes the first-generation seed are covered with group III nitride crystals grown on the first-generation seed.

5. A method according to claim 4, wherein the group III nitride crystals are grown in supercritical ammonia.

6. A method according to claim 1, wherein the ingot is sliced into wafers with a multiple wire saw having a different wire pitch for the wafer which includes the first-generation seed.

7. A method according to claim 1, wherein the first-generation seed comprises two pieces of c-plane (misorientation within +/−10 degrees) group III nitride wafers with group III polar surface facing together so that nitrogen polar surfaces are exposed on both faces.

8. A method according to claim 7, wherein the in-plane crystallographic orientation of the c-plane (misorientation within +/−10 degrees) group III nitride wafers matches together.

9. A method according to claim 7, wherein cracks generated in the group III nitride crystals do not propagate through the interface of the c-plane (misorientation within +/−10 degrees) group III nitride wafers.

10. A method according to claim 7, wherein the shape and size of the c-plane (misorientation within +/−10 degrees) group III nitride wafers matches so that minimum area of group III polar surface is exposed.

11. A method according to claim 1, wherein the first-generation seed comprises two layers of c-plane (misorientation within +/−10 degrees) group III nitride wafers with group III polar surface facing together so that nitrogen polar surfaces are exposed on both faces, each layer consists of multiple pieces of c-plane (misorientation within +/−10 degrees) group III nitride wafers arrayed on edges, the edges of the c-plane (misorientation within +/−10 degrees) group III nitride wafers on the first layer do not correspond to the edges of the c-plane (misorientation within +/−10 degrees) group III nitride wafers on the second layer, and in-plane crystallographic orientation of all wafers on the first and second layer matches.

12. A method according to claim 11, wherein cracks generated in the group III nitride crystals do not propagate through the interface of the two layers of c-plane (misorientation within +/−10 degrees) group III nitride wafers.

13. A method according to claim 11, wherein the size and shape of each layer matches so that minimum area of group III polar surface is exposed.

14. A method according to claim 13, wherein the edge of the longer dimension of each layer is aligned to a-plane (misorientation within +/−10 degrees).

15. A method according to claim 1, wherein the group III nitride comprises gallium nitride.

16. A method according to claim 1 wherein the second wafer is formed from the first group III nitride crystal and the third wafer is formed from the second group III nitride crystal.

17. A method according to claim 1 wherein the first group III nitride crystal has a crystalline structure polarity and the second group III nitride crystal has said crystalline structure polarity.

18. A method of fabricating group III nitride wafers composed of $Ga_xAl_yIn_{1-x-y}N$ ($0 \leq x \leq 1$, $0 \leq x+y \leq 1$) comprising:
   (a) growing group III nitride crystals on both faces of a seed of group III nitride to form an ingot of group III nitride;
   (b) slicing the ingot of group III nitride into wafers with a multiple wire saw wherein the pitch of the wire is changed so that the wafer which includes the seed is thicker than other wafers sliced from the ingot.

19. A method according to claim 18, wherein the thickness of the wafer which includes the seed crystal is large enough to avoid breaking of the wafer.

20. A method according to claim 18, wherein the group III nitride crystals are grown in supercritical ammonia.

21. A method according to claim 18, wherein the group III nitride comprises gallium nitride.

* * * * *